(12) United States Patent
Nehrke et al.

(10) Patent No.: US 6,777,935 B2
(45) Date of Patent: Aug. 17, 2004

(54) MR METHOD FOR GENERATING NAVIGATOR PULSES

(75) Inventors: Kay Nehrke, Elmshorn (DE); Peter Börnert, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/306,600

(22) Filed: Nov. 27, 2002

(65) Prior Publication Data

US 2003/0117137 A1 Jun. 26, 2003

Related U.S. Application Data

(63) Continuation of application No. 09/728,111, filed on Dec. 1, 2000, now Pat. No. 6,573,719.

(30) Foreign Application Priority Data

Dec. 1, 1999 (DE) .......................................... 199 57 754

(51) Int. Cl.[7] ................................................. G01V 3/00
(52) U.S. Cl. ....................................... 324/309; 324/307
(58) Field of Search ................................ 324/309, 307, 324/306, 300, 312, 314

(56) References Cited

U.S. PATENT DOCUMENTS 4,794,337 A * 12/1988 Twieg ......................... 324/309
5,122,747 A * 6/1992 Riederer et al. ............ 324/309
6,321,107 B1 * 11/2001 Derbyshire ................. 600/410
6,573,719 B2 * 6/2003 Nehrke et al. .............. 324/312

FOREIGN PATENT DOCUMENTS

EP         0498570 A2    12/1992    ........... A61B/5/026

OTHER PUBLICATIONS

Butts et al: Isotropic Diffusion–Weighted And Spiral–Navigated Interleaved EPI For Routine Imaging Of Acute Stroke Magnetic Resonance In Medicine, Academic Press, Bd. 38, Nr. 5, 1997, pp. 741–749.
Sachs et al.: "Real–Time Motion Detection In Spiral MRI Using Navigators" Magnetic Resonance In Medicine, Academic Press, Bd. 32, Nr. 5, Nov. 1, 1994, pp. 639–645.

* cited by examiner

Primary Examiner—Louis Arana
(74) Attorney, Agent, or Firm—John F. Vodipia

(57) ABSTRACT

The invention relates to an MR method in which a navigator pulse is generated to excite a nuclear magnetization in a spatially limited volume by at least one RF pulse and at least two gradient magnetic fields having gradients which extend differently in respect of time and space. After the navigator pulse excitation, at least one MR signal is received from the volume in conjunction with a further gradient magnetic field for evaluation. In order to enhance the navigator pulse, a variation in time is imposed on the gradient magnetic fields in order to generate at least two MR signals which correspond to an excitation in the k space along mutually offset trajectories. The MR signals are combined.

10 Claims, 5 Drawing Sheets

MR METHOD FOR GENERATING NAVIGATOR PULSES

CROSS REFERNECT TO RELATED APPLICATIONS

Figure 1:
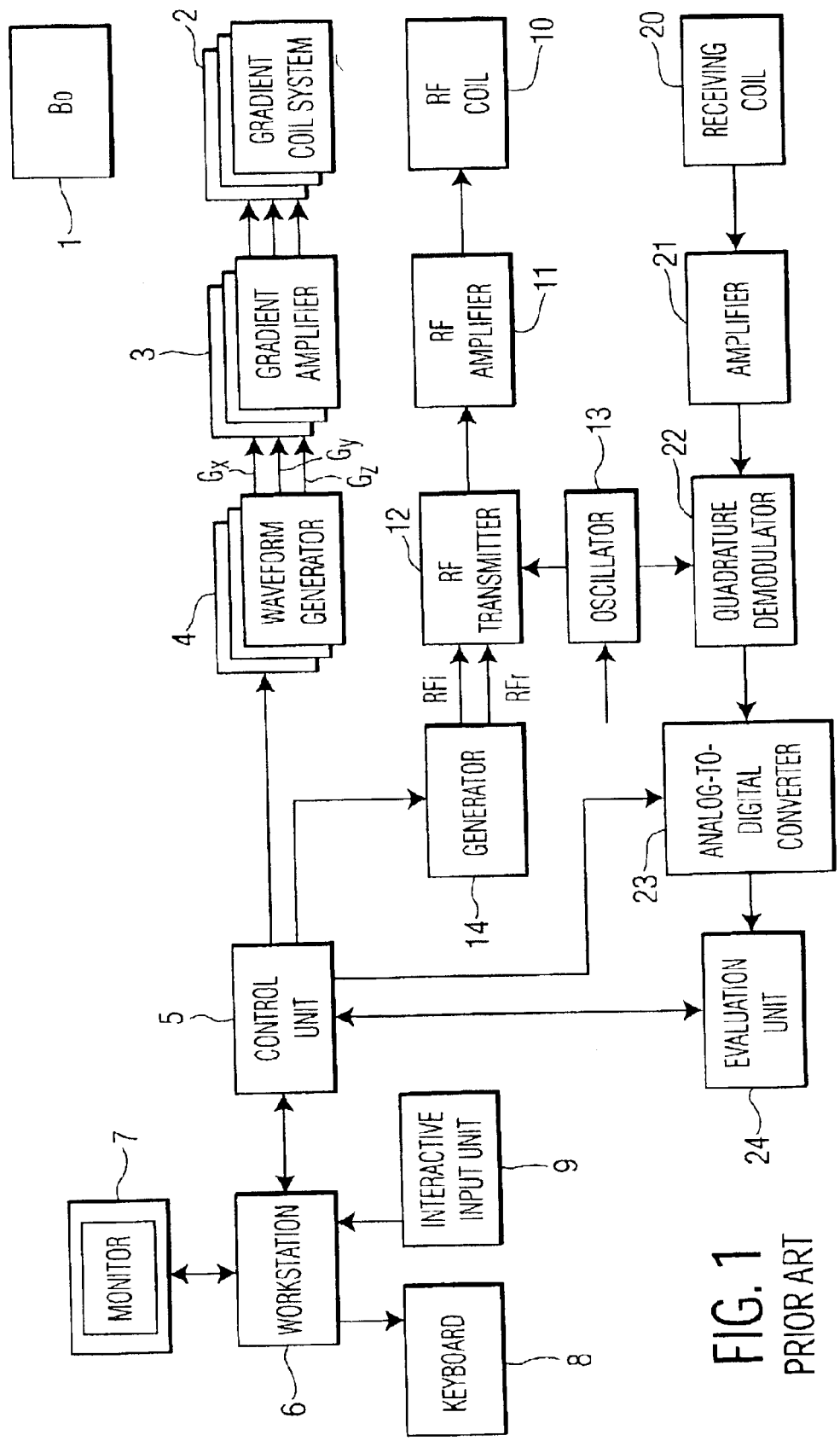

This application is a con Ser. No. 09/728,111 Dec. 1, 2000 now U.S. Pat. No. 6,573,719.

BACKGROUND OF THE INVENTION

1. Field of the Invention

The invention relates to a magnetic resonance (MR) method in which a navigator pulse is generated so as to excite the nuclear magnetization in a spatially limited volume by means of at least one RF pulse and at least two gradient magnetic fields having gradients which extend differently in respect of time and space, after which at least one MR signal is received from the volume, in conjunction with a further gradient magnetic field, so as to be evaluated. The invention also relates to an MR apparatus for carrying out such a method as well as to a computer program for a control unit of an MR apparatus for carrying out such a method.

2. Description of the Related Art

A method of the kind set forth is known from European patent application EP-A 0793113, as well as from an article by Nehrke Börnert et al, in the magazine "Magnetic Resonance Imaging", Vol. 17, No. 8, pp. 1173–1181, 1999. Navigator pulses enable the excitation of a zone limited in two dimensions, for example a cylindrical bar (pencil beam). When such a navigator pulse is incident, for example on the diaphragm of a patient, the state of motion thereof (or the respiration of the patient) can be determined by evaluation of the MR signals received after the navigator pulse. These pulses can be used for the detection of the state of motion of an object to be examined, for example in the so-called gating techniques.

Because the strength of the gradient is limited, only a region of limited dimensions and of finite density can be traversed in the k space during the finite duration of the navigator pulse. This limits the resolution and also give rise to the excitation of undesirable aliasing structures which may obstruct the detection of the state of motion. If navigator pulses of longer duration were used so as to enable a larger region to be traversed in the k space with a larger density, so-called "off-resonance" effects would become manifest, for example due to the inhomogeneity of the steady magnetic field whereto the object to be examined is exposed during an MR examination. Because of such effects the region excited by the navigator pulse is extended so that the evaluation of the MR signals is also impeded.

OBJECTS AND SUMMARY OF THE INVENTION

It is therefore an object of the present invention to conceive a method of the kind set forth in such a manner that a more favorable compromise is reached between the need for an enhanced resolution, or reduced aliasing structures, on the one hand and the duration of the navigator pulses on the other hand.

This object is achieved in a first manner which is characterized in that the variation in time of the gradient magnetic fields is such that there are generated at least two MR signals which correspond to an excitation in the k space along mutually offset trajectories, and in that the MR signals are combined.

The two (or more) MR signals can be generated by means of two (or more) RF pulses, the gradient fields that are active in conjunction therewith being configured in such a manner that the k space is traversed along offset trajectories. When these MR signals (or the Fourier transforms of these MR signals) are combined, the same spatial resolution, or reduction of the aliasing structures, can be achieved as if the k space were excited along all trajectories by means of a single RF pulse of the same duration.

However, such MR signals can also be generated by utilizing only a single RF pulse and by reading out the excited nuclear magnetization several times along different trajectories. This yields the same effect as would be obtained by using an RF pulse of the same duration and gradient fields having such a strength that all (mutually offset) trajectories were traversed with this single RF pulse.

The k space can then be traversed in various ways, for example along helical trajectories extending radially through the origin of k space. However, by implementing the inventive method herein such that a first gradient magnetic field ($G_x$) is generated during the RF pulse, its gradient extending in a first direction and its polarity being repeatedly reversed between a positive and a negative value, and a second gradient magnetic field ($G_{y1}$; $G_{y2}$) having a gradient extending in a second direction is generated during the polarity reversal of the first gradient magnetic filed ($G_x$), k space is traversed along parallel trajectories upon excitation by the RF pulse. This excitation is an analogy to the so-called RPT sequence in which the k space is sampled along parallel trajectories after an excitation.

In conjunction with such excitation of the k space, in conformity with claim 3 it is possible to acquire at least two MR signals after an RF pulse. These MR signals correspond to the MR signals that would be obtained after excitation by several RF pulses where the k space would be traversed along several, mutually offset groups of trajectories.

In a further embodiment a third gradient magnetic field ($G_z$) is generated after the RF pulse its gradient extending in a third direction and its polarity being reversed at least once between a positive and a negative value where a gradient magnetic field is generated with a gradient extending in the second direction during the reversal of the polarity of the first field whose gradient extends in the second direction the time integral over this gradient is smaller than that during the RE pulse a respective MR signal is read out each time for a polarity of the third gradient magnetic field and the MR signals are combined. Such method provides that k space is traversed or sampled along parallel trajectories during the excitation as well as during the reading out. In these circumstances, however, the nuclear magnetization is not excited in a single "pencil beam" as desired but also, due to the aliasing effect, in further regions, (so-called aliasing peaks) which recur periodically in the second direction and affect the evaluation of the navigator signal.

But when such method is further qualified to assure that the polarity of the third gradient magnetic field is reversed once and the time integral over the second gradient amounts to half the time integral over this gradient during a polarity reversal of the first gradient magnetic field, the effects of the two aliasing peaks to both sides of the region actually to be excited can be eliminated by combination of the two MR signals then acquired. And where the polarity of the third gradient magnetic field is reversed twice from one polarity to the other, and during such a polarity reversal, the time integral over the second gradient amounts to one quarter of the time integral over the second gradient during polarity reversal of the first gradient magnetic field, the effect of two further aliasing peaks can additionally be compensated.

Whereas in the embodiments so described, several (two or four) MR signals are acquired by means of only a single RF pulse, only one MR signal is received for each RF pulse where a region is excited by a plurality of navigator pulses along mutually offset trajectories in k space a respective MR signal is received, and the MR signals are combined. Such a method makes sense in the case of continuous generation of navigator pulses while the trajectories along which the k space is traversed during the excitation change cyclically.

In a variation on the above-described methods the invention includes an MR method in which a navigator pulse is generated so as to excite the nuclear magnetization in a spatially limited volume by means of at least one RE pulse and at least two gradient magnetic fields having gradients which extend differently with respect to time and space, after which at least one MR signal is received from the volume in conjunction with a further gradient magnetic field for evaluation during the excitation the gradient magnetic fields are generated with a variation in time such that the trajectories are limited to one half of the k space the resultant MR signal (comprising a real part and an imaginary part) is received in a phase-sensitive manner and the real part of the MR signals is exclusively evaluated The trajectories then-followed are limited to one half of the k space. Moreover, the real part of the nuclear magnetization vector then-remains unmodified (in comparison with a method where both halves of the k space are traversed with the same density of the trajectories). It follows that the imaginary part leads to widening. When only the real part of the MR signal is then-used instead of the absolute value of the MR signal during the evaluation of the navigator signal, the same spatial resolution can be achieved as before. This method can be used for all trajectories which symmetrically excite the k space. In conformity with the claims appended hereto, however, it is particularly effective to traverse the k space along parallel trajectories during the excitation, analogous to the EPI sequence during the reading out of MR signals.

The first solution, in as far as it is limited to two MR signals, and the second solution utilize given effects (that the effect of the aliasing peaks can be eliminated by combination of the MR signals or that the real part of the nuclear magnetization excited in these peaks does not lead to widening).

MR apparatus for carrying out the MR methods described herein is also set forth in the detailed description to follow and the claims amended hereto. The software for a control unit of an MR apparatus which is suitable for carrying out the aforementioned methods of this invention are also described in the following detailed description and in the claims appended hereto.

BRIEF DESCRIPTION OF THE DRAWING FIGURES

Figure 2:
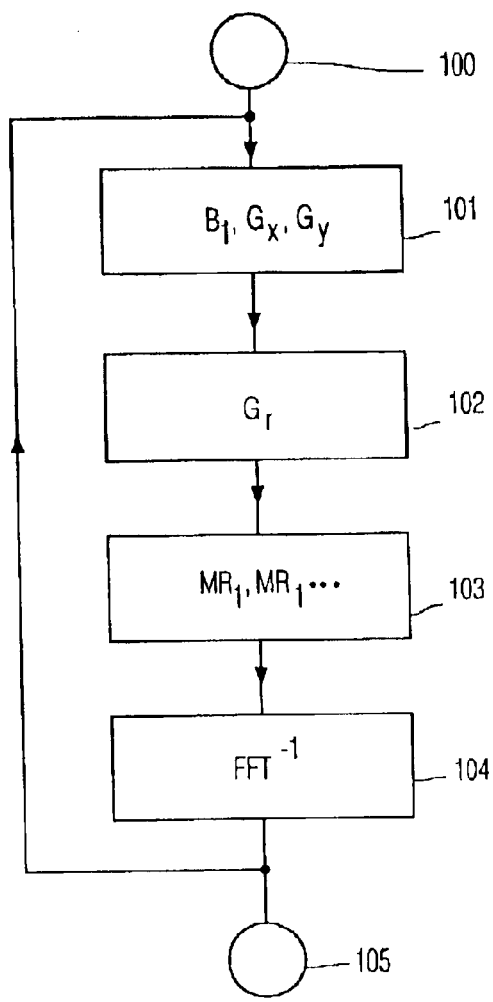
Figure 6:
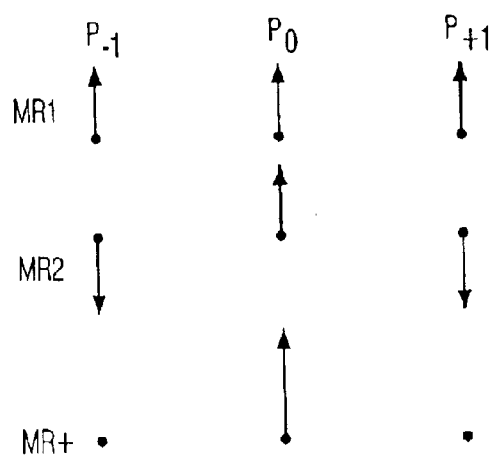
Figure 3:
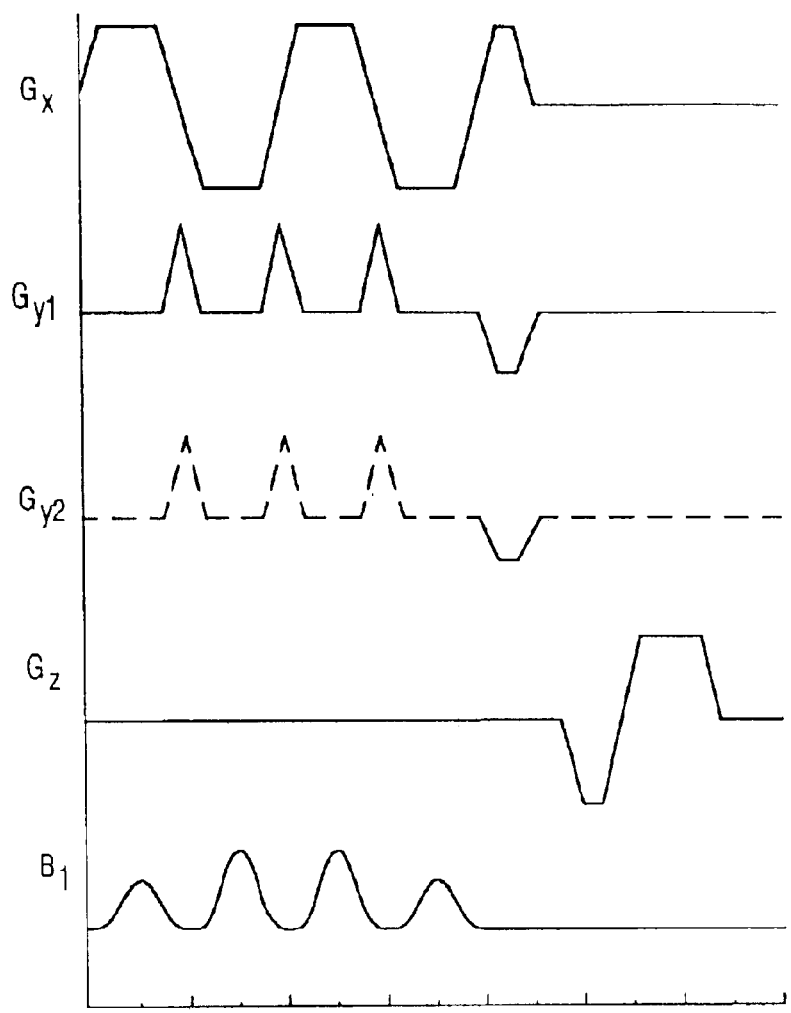
Figure 4:
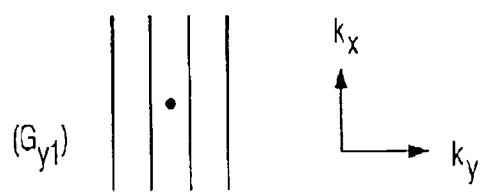
Figure 4:
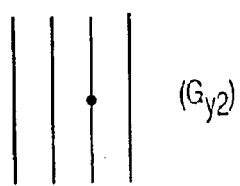
Figures 5A, 5B:
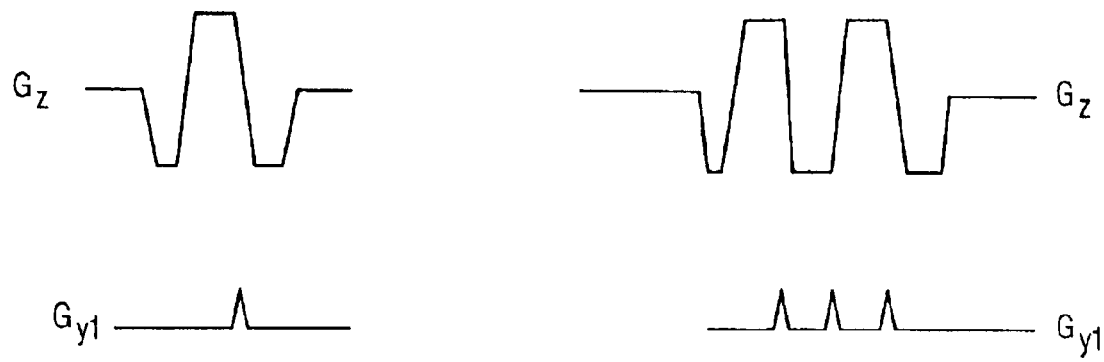
Figure 7:
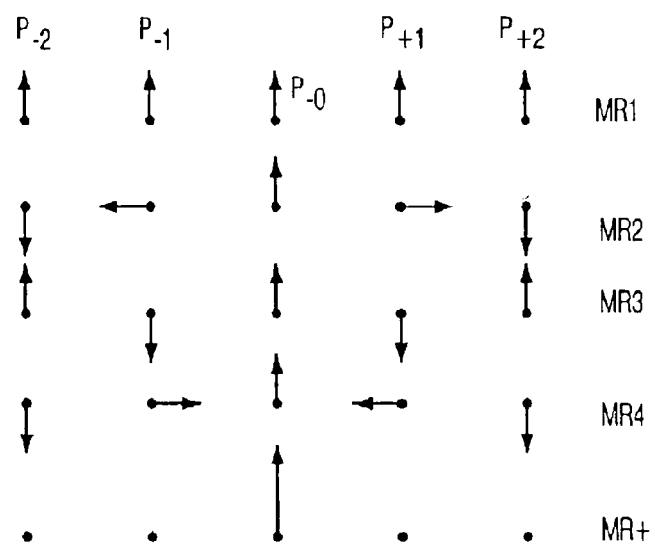
Figure 8:
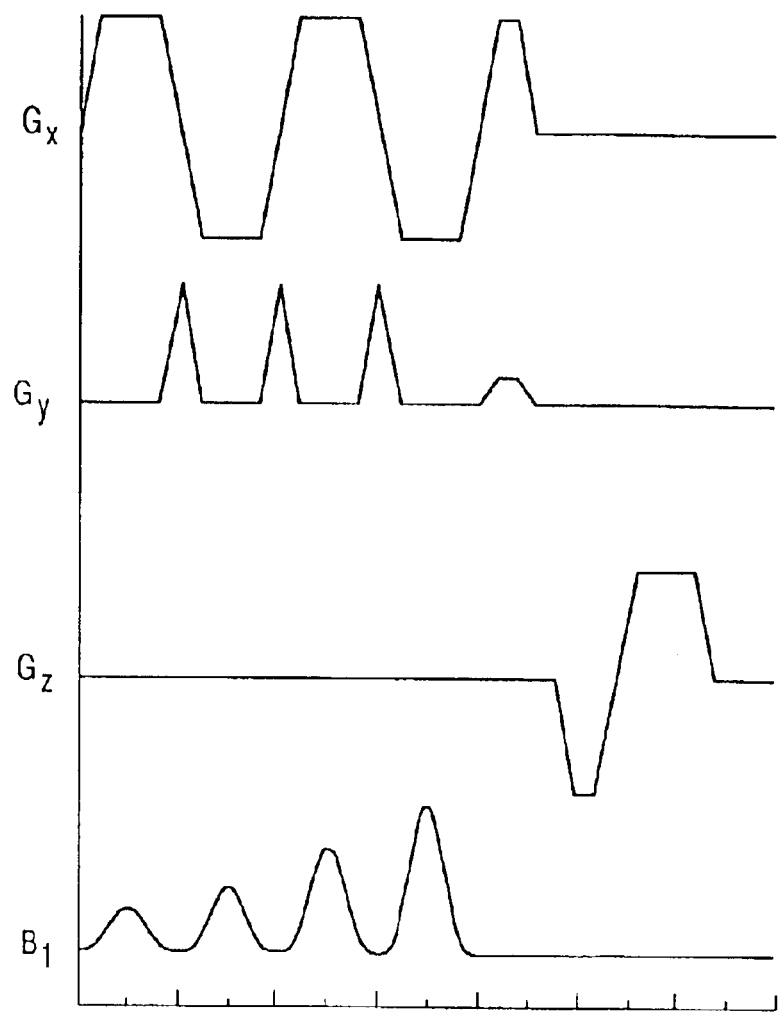
Figure 9:
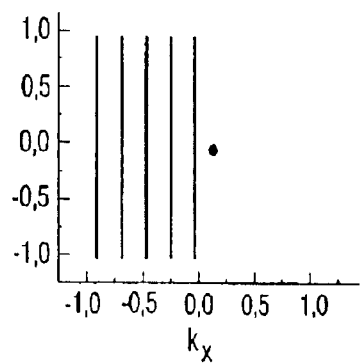

The invention will be described in detail hereinafter with reference to the drawings.
Therein:

FIG. 1 shows the block diagram of an MR apparatus which is suitable for carrying out the invention, FIG. 2 shows a flow chart illustrating the method according to the invention, FIG. 3 shows the variation in time of various signals involved in the method according to the invention, FIG. 4 shows the associated course of the trajectories in the k space, FIGS. 5a and 5b show various modifications of the method of FIG. 3, FIGS. 6 and 7 show the phase position in the associated aliasing peaks, FIG. 8 shows the variation in time of various magnetic fields in a further version of the invention, and FIG. 9 shows the associated trajectory in the k space.

DETAILED DESCRIPTION OF THE INVENTION

The reference numeral 1 in FIG. 1 denotes a diagrammatically represented main field magnet which generates a steady, essentially uniform magnetic field of a strength of for example 1.5 Tesla which extends in the z direction in an examination zone (not shown). The z direction extends in the longitudinal direction of an examination table (not shown) on which a patient is accommodated during an MR examination.

Also provided is a gradient coil system 2 which includes three coil systems which are capable of generating gradient magnetic fields $G_x$, $G_y$ and $G_z$ which extend in the z direction and have a gradient in the x direction, the y direction and the z direction, respectively. The currents for the gradient coil system 2 are supplied by a gradient amplifier 3. Their variation in time is controlled by a waveform generator 4, that is, separately for each direction. The waveform generator 4 is controlled by an arithmetic and control unit 5 which calculates the variation in time of the magnetic gradient fields $G_x$, $G_y$, $G_z$ required for a given examination method and loads these values into the waveform generator 4. These signals are read out from the waveform generator 4 for the MR examination so as to be applied to the gradient amplifiers 3 which generate therefrom the currents that are required for the gradient coil system 2.

The control unit 5 also acts on a workstation 6 which includes a monitor 7 for the display of MR images. Entries can be made via a keyboard 8 or an interactive input unit 9.

The nuclear magnetization in the examination zone can be excited by RF pulses from an RF coil 10 which is connected to an RF amplifier 11 which amplifies the output signals of an RF transmitter 12. In the RF transmitter 12 the (complex) envelopes of the RF pulses are modulated with the carrier oscillations that are supplied by an oscillator and whose frequency corresponds to the Larmor frequency (approximately 63 MHz in the case of a main field of 1.5 Tesla). The control and arithmetic unit loads the complex envelope into a generator 14 which is coupled to the transmitter 12.

The MR signals generated in the examination zone are picked up by a receiving coil 20 and amplified by an amplifier 21. The amplified MR signal is demodulated in a quadrature demodulator 22 by way of two 90° offset carrier oscillations of the oscillator 13, so that two signals are generated which may be considered as the real part and the imaginary part of a complex MR signal. These signals are applied to an analog-to-digital converter 23 which forms MR data therefrom. The MR data is subjected to various processing operations in an evaluation unit 24, inter alia a Fourier transformation.

FIG. 2 shows the execution of the method according to the invention under the control of the control unit 5. After the initialization in the block 100, a navigator pulse is generated (block 101). FIG. 3 shows the variation in time of the gradient magnetic fields and the amplitude of the RF pulse required for this purpose. During the excitation phase not only the RF pulse $B_1$ (fourth line) is active, but also a gradient magnetic field $G_x$ (first line) which has a gradient in the x direction and a gradient magnetic field which has a gradient in the y direction, either the variation $G_{y1}$ (second line) or the variation $G_{y2}$ (third line) being imposed by the waveform generator 4 (FIG. 1).

The gradient $G_x$ then changes its polarity repeatedly between a positive and a negative value, the absolute values of said two values is identical and the transition between the two values takes place in a ramp-like manner. Upon each change of polarity there is generated a brief pulse, that is, a so-called "blip"; all blips have the same magnitude and the same polarity. For the sake of simplicity the drawing shows only three changes of polarity or three blips. However, there may also be envisaged a different, notably larger number of changes of polarity or blips, for example from eight to twelve. After the RF pulse, the gradient $G_{y1}$ is applied with opposed polarity, that is, in such a manner that the time integral is 1.5 times larger than the time integral over one of the blips, so that it amounts to half the time integral over all blips during the RF pulse. At the same time there is applied a positive half-oscillation of the gradient $G_x$ whose time integral amounts to half of that of the preceding half-oscillations.

The associated trajectory in the k space (in this respect see the cited publication by Nehrke, Börnert et al.) is given by the following equation:

$$k(t) = -\gamma \int_t^T G(t')dt' \quad (1)$$

In this respect it is assumed that the RF pulse commences at the instant t'=0 and terminates at the instant t'=T. G represents the magnetic gradient field, being the gradient field $G_x$ and $G_{y1}$ in the example of FIG. 3. The resultant trajectory is shown in FIG. 4 (upper part). The trajectory comprises four equidistant, mutually parallel lines which extend in the $k_x$ direction and are symmetrically situated relative to the zero point ($k_x=0$, $k_y=0$) of the k space. This symmetry results from the described variation in time of $G_{y1}$ and $G_x$ after the RF pulse.

In conformity with FIG. 2 a gradient magnetic field is generated subsequent to the excitation of the nuclear magnetization in the step 102, that is, the so-called read-out gradient which takes the form of a gradient which extends in the z direction; a half-oscillation with a first (negative) polarity is then succeeded by a half-oscillation of the opposite polarity, the time integral over the second half-oscillation being exactly twice as large as the time integral over the first half-oscillation, so that the k space is sampled symmetrically relative to its zero point.

The MR signal (MRI) occurring during the positive polarity of the gradient is received in the block 103 so as to be digitized and subsequently processed, notably subjected to a Fourier transformation in a step identified as block 104.

Subsequently, the sequence is repeated, be it that the variation of the gradient extending in the y direction is in conformity with the dashed line $G_{y2}$ (third line of FIG. 3) instead of the line $G_{y1}$ (second line). The position and the variation in time of the blips are then identical to $G_{y1}$; merely the negative half-oscillation deviates from that of $G_{y1}$ in that the time integral over this half-oscillation corresponds exactly to the time integral over one blip; this means that it is half a blip smaller than in the case of $G_{y1}$. Consequently, the resultant trajectory in the k space (at the bottom) is offset over half the distance between two neighboring lines relative to the trajectory during the preceding excitation (at the top).

One of the k space lines thus extends through the zero point of the k space. The MR signal (MR2) arising after this excitation is read out (block 103) and processed in the same way as after the first excitation; the two MR signals are added either before or after the Fourier transformation.

The effect of this step will be illustrated hereinafter with reference to FIG. 6. As has already been stated, the nuclear magnetization is excited not only in the desired region (denoted by the reference $P_0$ in FIG. 6), but further peaks of the nuclear magnetization also occur (the next two peaks are denoted by the references $P_{-1}$ and $P_{+1}$ in FIG. 6); such peaks are periodically recurrent. The width of the peaks is smaller as the largest k value $k_{max}$ is larger.

It is assumed that the vectors of the nuclear magnetization in the peaks vary as shown in FIG. 6 for the first MR signal MR1. The signs of the two neighboring peaks $P_{-1}$ and $P_{+1}$ are reversed for the second MR signal MR2 because of the shift by one half line in the k space. As a result of the addition of the two MR signals, the peaks thus compensate one another at the positions $P_{-1}$ and $P_{+1}$ so that nuclear magnetization continues to exist only in the region $P_0$, because the nuclear magnetization in the two signals has the same phase.

As will yet be demonstrated, the peaks that are situated to the left and the right and are not shown in FIG. 6 also remain unaffected. The combination and Fourier transformation of the two MR signals MR1 and MR2 thus has the same effect as a navigator pulse whose trajectory would have double the number of the k space lines with half the distance between the lines. Such a navigator pulse, however, would require gradient magnetic fields with stronger gradients, so that the k space could be traversed faster, or a longer pulse duration this would cause the peaks to widen because of the inhomogeneities of the steady magnetic field. Block 105 indicates the end of the process.

For the embodiment described with reference to FIG. 3 it is necessary that the navigator pulses are generated continuously and at short intervals, the gradient variations $G_{y1}$ and $G_{y2}$ being alternately used. For a measurement it is necessary to combine the MR signals of two successive navigator pulses. However, it is also possible to achieve the same result by means of a single navigator pulse only as will be explained in detail hereinafter on the basis of the modifications of the sequence of FIG. 3 which are shown in the FIGS. 5a and 5b. The gradient magnetic field $G_{y2}$ (third line of FIG. 3) is then completely dispensed with and merely $G_z$ and $G_{y1}$ are modified after the navigator pulse. In conformity with FIG. 5a the positive half-oscillation of the read-out gradient $G_z$, in which a first MR signal (MR1) is read out, is succeeded by a negative half-oscillation in which a second MR signal (MR2) is read out. During the polarity reversal of the read-out gradient a blip of the magnetic gradient field $G_{y1}$ is activated in addition to the variation shown on the second line of FIG. 3. The time integral over this blip amounts to half the time integral over each of the blips during the navigator pulse.

Consequently, the trajectory at the top of FIG. 4 is shifted in the $k_y$ direction over half the distance between two neighboring lines of this trajectory, so that the lower trajectory is obtained. The two resultant MR signals are added and subsequently Fourier transformed while taking into account the time reversal (resulting from the refocusing by the second half-oscillation of the read-out gradient). The contributions by the aliasing peaks are then averaged out again.

The versions of the method of the invention as illustrated with reference to the FIGS. 3 and 5a enable compensation of the effect of the aliasing peaks neighboring the region to be excited ($P_0$ in FIG. 6). This may be adequate in various cases. However, the effect of the peaks situated further outwards is not influenced thereby. In conjunction with FIG. 5b a modification of the sequence of the FIGS. 3 and 5a will now be described; this modification also enables compensation of the effect of the next aliasing peaks but one.

To this end, the variation of $G_z$ and $G_{y1}$ (after the navigator pulse) shown in FIG. 5a is replaced by the variation shown in FIG. 5b. Four half-oscillations of the read-out gradient $G_z$ are now envisaged (instead of two); during these half-oscillations a respective MR signal is received. In response to each of the three polarity reversals from a positive to a negative polarity and vice versa there is generated a blip of the gradient $G_{y1}$. The time integral over such a blip amounts to one quarter of the time integral over a blip during the navigator pulse. The four MR signals MR1, MR2, MR3, MR4 received, therefore, are associated with four trajectories which are offset relative to one another by each time one quarter of the distance between two lines in the k space of a trajectory (instead of half this distance as indicated in FIG. 4).

The effect of this step is illustrated by FIG. 7 for which it is assumed that the phase of the nuclear magnetization in the regions $P_{-2}$ to $P_{+2}$ has the indicated direction upon reception of the first signal MR1. At the second MR signal MR2 the phase is shifted 90° in the regions $P_{-1}$ and $P_{+1}$, whereas the phase in the next regions but one ($P_{-2}$ and $P_{+2}$) is shifted 180°. At the third MR signal MR3 the same phase position is obtained as indicated for the three innermost peaks in FIG. 6, that is, the phase position in the region $P_0$ is still the same in comparison with the first MR signal MR1, whereas that in the regions $P_{-1}$ and $P_{+1}$ has been inverted. In the regions $P_{-2}$ and $P_{+2}$ it is the same again as for the signal MR1. Finally, at the fourth signal MR4 the phase position in the region $P_0$ is still the same whereas in the regions $P_{-1}$ and $P_{+1}$ the phase has been shifted 90° relative to the first signal and 180° relative to the second signal. The phase position in the next aliasing peaks but one, that is, in the regions $P_{-2}$ and $P_{+2}$, has been inverted again relative to the first MR signal MR1.

When all MR signals are added (while taking into account again the time reversal caused by the refocusing), the effects of the next ($P_{-1}$, $P_{+1}$) aliasing peaks and the next aliasing peaks but one ($P_{-2}$, $P_{+1}$) compensate one another whereas the effects of the central region are added. The Fourier transformed signal resulting from the combination, therefore, is influenced exclusively by the proton density in the cylindrical bar (pencil beam) corresponding to the region $P_0$.

A further version of the method will be described in detail hereinafter with reference to the FIGS. 8 and 9. FIG. 8 shows the variation in time of the gradient magnetic fields during the excitation or during the reading-out. The following differences exist in comparison with the sequence shown in FIG. 3. The time integral over the rephasing gradient, that is, over the negative half-oscillation of $G_{y1}$ after the RF pulse, amounts to half the time integral over one blip. The center (the zero point) of the k space, therefore, is not reached at the temporal center of the RF pulse but at the end thereof. Consequently, the amplitude does not reach its maximum at the center of the RF pulse either, but at the end thereof. Consequently, the trajectory is situated exclusively in one half of the k space.

It can be demonstrated that in the case of such a trajectory the real part has the same peak width and the same distances between the aliasing peaks as a navigator pulse whose trajectory comprises twice as many lines in the k space as that shown in FIG. 9 and extends symmetrically relative to the center of the k space. In the imaginary part of the excitation profile, however, widening occurs. When the evaluation of the navigator signal utilizes only its real part of the MR signal instead of its absolute amount, the same resolution, or an increase of the distance between the aliasing peaks, can be achieved as in the case of a navigator pulse whose trajectory (with double the number of lines and the same distance between the lines from one another) extends symmetrically relative to the center of the k space.

For the evaluation of only the real part of the MR signal it is necessary that the MR signal can be detected in a phase-sensitive manner; however, this is the case as has already been described with reference to FIG. 1. Moreover, other phase shifts requiring correction may also occur. A constant phase is obtained inter alia from the position in time of the sampling instants during the digitization of the MR signal. It can be determined by deactivating all gradients in the sequence of FIG. 8, so that only the RF pulse $B_1$ is active.

A phase which varies linearly in time is obtained from the position of the read-out gradient $G_z$ in FIG. 8 relative to the spin system. This phase can be determined by executing the sequence of FIG. 8 without the gradients $G_x$ and $G_y$ that are active in the excitation phase.

What is claimed is:

1. An magnetic resonance MR method including the steps of:

generating a navigator pulse to excite the nuclear magnetization in a spatially limited volume by means of at least one RF pulse and at least two gradient magnetic fields having gradients which extend differently with respect to time and space, receiving at least one MR signal from the volume, in conjunction with a further gradient magnetic field for evaluation, wherein variation in time of the gradient magnetic fields results in the generation of at least two MR signals which correspond to an excitation in k space along mutually offset trajectories, and combining the MR signal.

2. The MR method as claimed in claim 1, wherein a first gradient magnetic filed ($G_x$) is generated during the RF pulse, its gradient extending in a first direction and its polarity being repeatedly reversed between a positive and a negative value, and wherein a second gradient magnetic field ($G_{y1}$; $G_{y2}$), having a gradient extending in a second direction, is generated during the polarity reversal of the first gradient magnetic field ($G_x$).

3. The MR method as claimed in claim 2, wherein a third gradient magnetic field ($G_z$) is generated after the RF pulse, its gradient extending in a third direction and its polarity being reversed at least once between a positive and a negative value, wherein a gradient magnetic field is generated with a gradient extending in the second direction during the reversal of the polarity of the first field whose gradient extends in the second direction, the time integral over this gradient being smaller than that during the RF pulse, wherein a respective MR signal is read out each time for a polarity of the third gradient magnetic field, and wherein said MR signals are combined.

4. The MR method as claimed in claim 1, wherein
a region is excited by a plurality of navigator pulses along mutually offset trajectories in k space,
a respective MR signal is received, and
the MR signals are combined.

5. An MR method including steps of:
generating a navigator pulse to excite a nuclear magnetization in a spatially limited volume by means of at least one RF pulse and at least two gradient magnetic fields having gradients which extend differently with respect to and space,
receiving at least one MR signal from the volume, in conjunction with a further gradient magnetic field for evaluation
wherein
during the excitation, the gradient magnetic fields are generated with a variation in time to limit corresponding trajectories to one half of the k space, wherein
the resultant MR signal, comprising a real part and an imaginary part, is received in a phase-sensitive manner, and wherein
the real part of the MR signals is evaluated exclusively.

6. The MR method as claimed in claim 5, wherein
a first gradient magnetic field is generated during the RF pulse, its gradient extending in a first direction and its polarity being repeatedly reversed between a positive and a negative value, and wherein
a second gradient magnetic field, having a gradient extending in a second direction, is generated during the polarity reversal of the first gradient magnetic field.

7. An MR apparatus which includes
an RF transmitter for generating magnetic RF pulses,
a receiver for receiving MR signals,
a generator for generating gradient magnetic fields having gradients which extend differently in respect of time and space,
an evaluation unit for processing the MR signals received, and
a control unit which controls the RF transmitter, the receiver, the generator and the evaluation unit and which is programmed to implement the following steps:
exciting nuclear magnetization in an examination zone by means of at least one RF pulse,
generating of gradient magnetic fields which vary in time to generate at least two MR signals which correspond to an excitation in the k space along mutually offset trajectories, and
receiving and combining of the MR signals.

8. An MR apparatus includes:
an RF transmitter for generating magnetic RF pulses,
a receiver for receiving MR signals,
a generator for generating gradient magnetic fields having gradients which extend differently with respect to time and space,
an evaluation unit for processing the MR signals received, and
a control unit which controls the RF transmitter, wherein the receiver, the generator and the evaluation unit are programmed to conduct the following steps:
exciting nuclear magnetization in an examination zone by means of at least one RF pulse,
generating gradient magnetic fields during the excitation, which fields vary in time to limit the trajectories to one half of the k space,
receiving resultant MR signal, which comprises a real part and an imaginary part, in a manner which is phase-sensitive, and
exclusively evaluating real part of the MR signals.

9. A computer program for a control unit of an MR apparatus, which control unit controls an RF transmitter, a receiver, a generator, and to perform an evaluation, the computer program implementing the steps of:
exciting nuclear magnetization in an examination zone by means of at least one RF pulse,
generating gradient magnetic fields with a variation in time to generate at least two MR signals which correspond to an excitation in k space along mutually offset trajectories, and
receiving and combining the MR signals.

10. A computer program for a control unit of an MR apparatus which is intended to control an RF transmitter, a receiver, a generator and an evaluation unit, the computer program arranged to carry out steps as follows:
exiting a nuclear magnetization in an examination zone by means of at least one RF pulse,
generating gradient magnetic fields during the excitation, which fields vary in time to limit corresponding the trajectories to one half of space,
phase-sensitive reception of the resultant MR signal which comprises a real part and an imaginary part,
and exclusively evaluating the real part of the MR signals.

* * * * *